(12) United States Patent
Hoshino et al.

(10) Patent No.: US 7,745,311 B2
(45) Date of Patent: Jun. 29, 2010

(54) WORKING METHOD FOR AN OPTICAL DEVICE WAFER

(75) Inventors: Hitoshi Hoshino, Ota-ku (JP); Takashi Yamaguchi, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/500,162

(22) Filed: Jul. 9, 2009

(65) Prior Publication Data

US 2010/0047999 A1   Feb. 25, 2010

(30) Foreign Application Priority Data

Aug. 22, 2008   (JP) .............................. 2008-213864

(51) Int. Cl.
   *H01L 21/00*   (2006.01)
(52) U.S. Cl. .................... 438/463; 438/455; 438/461
(58) Field of Classification Search ......... 438/455–465, 438/33; 219/121.72
   See application file for complete search history.

(56) References Cited

U.S. PATENT DOCUMENTS

| 7,601,616 B2* | 10/2009 | Morikazu et al. ........... 438/463 |
| 7,622,366 B2* | 11/2009 | Nakamura ................... 438/463 |
| 2005/0009301 A1* | 1/2005 | Nagai et al. ................. 438/463 |
| 2009/0124063 A1* | 5/2009 | Nakamura ................... 438/463 |
| 2009/0142906 A1* | 6/2009 | Nakamura ................... 438/463 |
| 2009/0197395 A1* | 8/2009 | Nakamura et al. ........... 438/463 |
| 2009/0215245 A1* | 8/2009 | Nakamura ................... 438/463 |
| 2009/0298263 A1* | 12/2009 | Watanabe et al. ............ 438/463 |
| 2009/0311848 A1* | 12/2009 | Hoshino et al. ............. 438/463 |
| 2010/0035408 A1* | 2/2010 | Hoshino et al. ............. 438/463 |
| 2010/0041210 A1* | 2/2010 | Hoshino et al. ............. 438/463 |

FOREIGN PATENT DOCUMENTS

| JP | A 10-305420 | 11/1998 |
| JP | A 2008-6492 | 1/2008 |

* cited by examiner

*Primary Examiner*—Walter L Linsay, Jr.
(74) *Attorney, Agent, or Firm*—Greer, Burns & Crain, Ltd.

(57) ABSTRACT

A dividing method for an optical device wafer includes a protective plate adhering step of releasably adhering the surface of an optical device wafer to the surface of a protective plate, a reverse face grinding step of grinding the reverse face of the optical device wafer, a dicing tape sticking step of sticking the reverse face of the optical device wafer on the surface of a dicing tape, a protective plate grinding step of grinding the reverse face of the protective plate adhered to the optical device wafer stuck on the dicing tape so as to have a predetermined thickness, a laser working step of irradiating a laser beam upon the protective plate along the streets formed on the optical device wafer to carry out laser working, which forms break starting points along the streets, for the protective plate, and a wafer dividing step of applying external force to the protective plate to break the protective plate along the break starting points to break the optical device wafer along the streets thereby to divide the optical device wafer into the individual optical devices.

4 Claims, 13 Drawing Sheets

FIG. 1 1 A
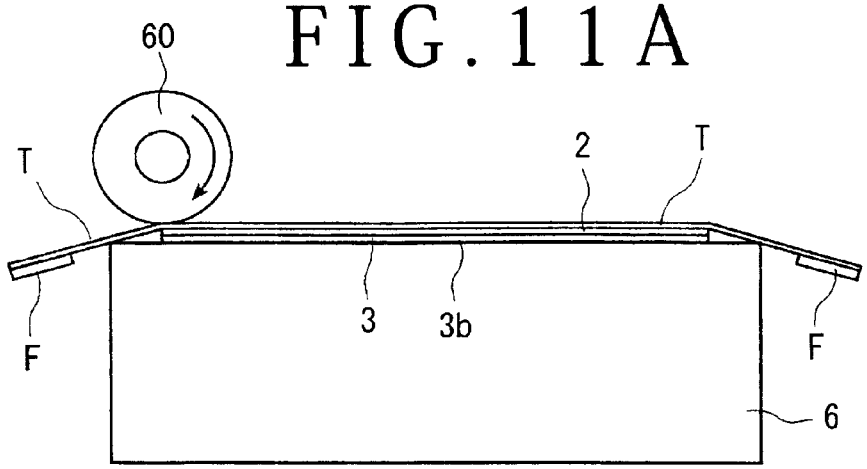
FIG. 1 1 B
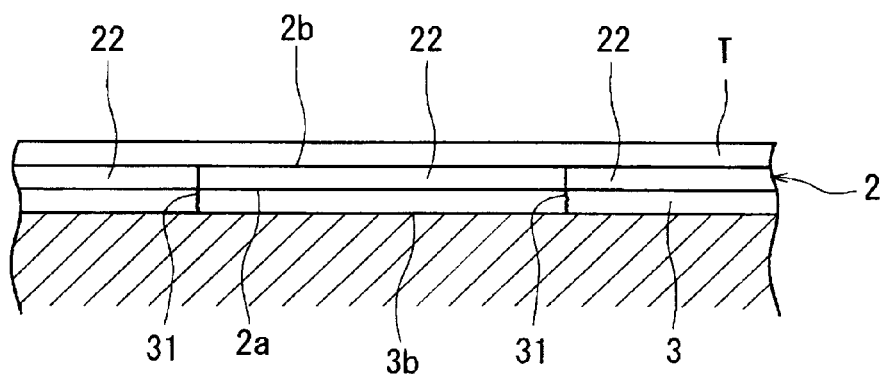
FIG. 1 1 C
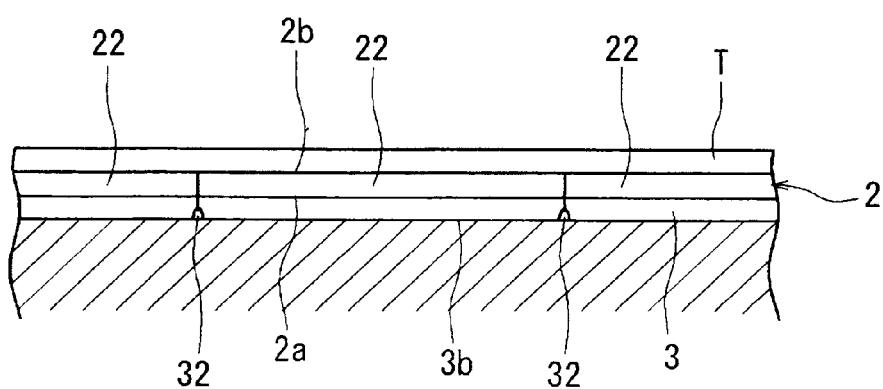

WORKING METHOD FOR AN OPTICAL DEVICE WAFER

BACKGROUND OF THE INVENTION

1. Field of the Invention

This invention relates to a working method for an optical device wafer for dividing an optical device wafer, which has a plurality of regions partitioned by streets formed in a lattice on the surface of a substrate such as a sapphire substrate and has optical devices of a gallium nitride-based compound semiconductor or the like laminated in the partitioned regions, into the individual optical devices along the streets.

2. Description of the Related Art

An optical device wafer which has a plurality of regions partitioned by planned parting lines called streets formed in a lattice on the surface of a sapphire substrate and has optical devices of a gallium nitride-based compound semiconductor or the like laminated in the partitioned regions is divided into the individual optical devices such as light emitting diodes along the streets and is utilized widely in electric apparatus. The optical device wafer described above is ground and worked on the reverse face thereof by a grinding apparatus before it is divided along the streets so as to have a predetermined thickness. In recent years, it is demanded to make the thickness of optical devices less than 50 µm in order to implement reduction in weight and size of electric apparatus. However, if an optical device wafer is ground so as to be as thin as less than 50 µm, then this gives rise to a problem that a crack occurs therewith.

Meanwhile, cutting of an optical device wafer along streets is normally carried out by a cutting apparatus which includes a cutting blade which rotates at a high speed for cutting. However, since a sapphire substrate is a material which has high Mors hardness and is difficult to cut, it is necessary to lower the working speed, and therefore, there is a problem that the productivity is low. In recent years, as a method for dividing a wafer such as an optical device wafer along streets, it has been proposed to irradiate a pulsed laser beam of a wavelength having absorbency with respect to a wafer along a street to form a laser worked groove and apply external force along the laser worked groove to break the wafer along the street (for example, refer to Japanese Patent Laid-Open No. Hei 10-305420).

Meanwhile, as a method for dividing a wafer such as an optical device wafer along a street, also it has been proposed to use a pulsed laser beam of a wavelength having permeability with respect a wafer and irradiate the pulsed laser beam along a street with a focus point thereof adjusted to the inside of the wafer to form a altered layer continuously along the street in the inside of the wafer and then apply external force along the street whose strength is decreased by the formation of the altered layer to break the wafer along the street (for example, refer to Japanese Patent Laid-Open No. 2008-6492).

The optical device wafer described above is formed with a predetermined thickness by grinding the reverse face thereof before it is divided into individual optical devices. In recent years, it is demanded to set the thickness of an optical device to less than 50 µm in order to achieve reduction in weight and size of electric apparatus. However, there is a problem that, if the optical device wafer is ground so as to be thinner than 50 µm, then a crack occurs therewith.

Further, if a laser beam is irradiated along a street of an optical device wafer to form a laser worked groove or a altered layer and the optical device wafer is divided into individual optical devices along such streets along which such laser worked grooves or altered layers as described above altered, then since altered substance produced by the laser working remains on side faces (break faces) of the individually divided optical devices, there is a problem that the luminance of the optical devices drops and the die strength drops.

SUMMARY OF THE INVENTION

Therefore, it is an object of the present invention to provide a dividing method for an optical device wafer by which an optical device wafer can be formed thin and besides the luminance of an optical device is not dropped and drop of the die strength can be prevented.

In accordance with an aspect of the present invention, there is provided a working method for an optical device wafer for dividing an optical device wafer having optical devices formed in a plurality of regions of a surface thereof partitioned by a plurality of streets formed in a lattice into the individual optical devices along the plural streets, including a protective plate adhering step of adhering the surface of the optical device wafer to a surface of a protective plate, which has high rigidity, by a releasable bonding agent, a reverse face grinding step of grinding a reverse face of the optical device wafer adhered to the protective plate so that the optical device wafer has a finish thickness of the devices, a dicing tape sticking step of sticking the reverse face of the optical device wafer, for which the reverse face grinding step has been carried out, on a surface of a dicing tape, a protective plate grinding step of grinding the reverse face of the protective plate adhered to the optical device wafer stuck on the dicing tape so as to have a predetermined thickness, a laser working step of irradiating a laser beam upon the protective plate, for which the protective plate grinding step has been carried out, along the streets formed on the optical device wafer to carry out laser working, which forms break starting points along the streets, for the protective plate, a wafer dividing step of applying external force to the protective plate, for which the laser working step has been carried out, to break the protective plate along the break starting points to break the optical device wafer along the streets thereby to divide the optical device wafer into the individual optical devices, and a pickup step of picking up the individually divided devices stuck on the dicing tape for which the wafer dividing step has been carried out.

Preferably, at the laser working step, a laser beam of a wavelength having permeability with respect to the protective plate is irradiated with a focus point thereof adjusted to the inside of the protective plate to form altered layers, which serve as the break starting points, along the streets in the inside of the protective plate.

Alternatively, at the laser working step, a laser beam of a wavelength having absorbency with respect to the protective plate may be irradiated to form laser worked grooves, which serve as the break starting points, along the streets on the reverse face of the protective plate.

Preferably, a protective plate removing step of removing the protective plate stuck on the divided optical devices before or after the pickup step is carried out after the wafer dividing step.

According to the present invention, when the reverse face grinding step of grinding the reverse face of an optical device wafer so that the optical device wafer has a finish thickness of devices is carried out, since the surface of the optical device wafer is adhered to the protective plate which has high rigidity, even if the optical device wafer is formed thin, it does not suffer from a crack. Further, since external force is applied along the break starting points of the protective plate, for which the laser working step described above has been carried out, to break the protective plate along the break starting points thereby to break the optical device wafer along the streets to divide the optical device wafer into the individual optical devices, a altered portion which is produced otherwise by the laser working does not exist on the side faces (break faces) of the divided optical devices. Therefore, the luminance of the optical devices does not drop and the die strength or the bending resisting strength does not drop either.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 11A to 11C are explanatory views illustrating a wafer dividing step in the dividing method for an optical device wafer according to the present invention;

DETAILED DESCRIPTION OF THE PREFERRED EMBODIMENTS

Figure 1:
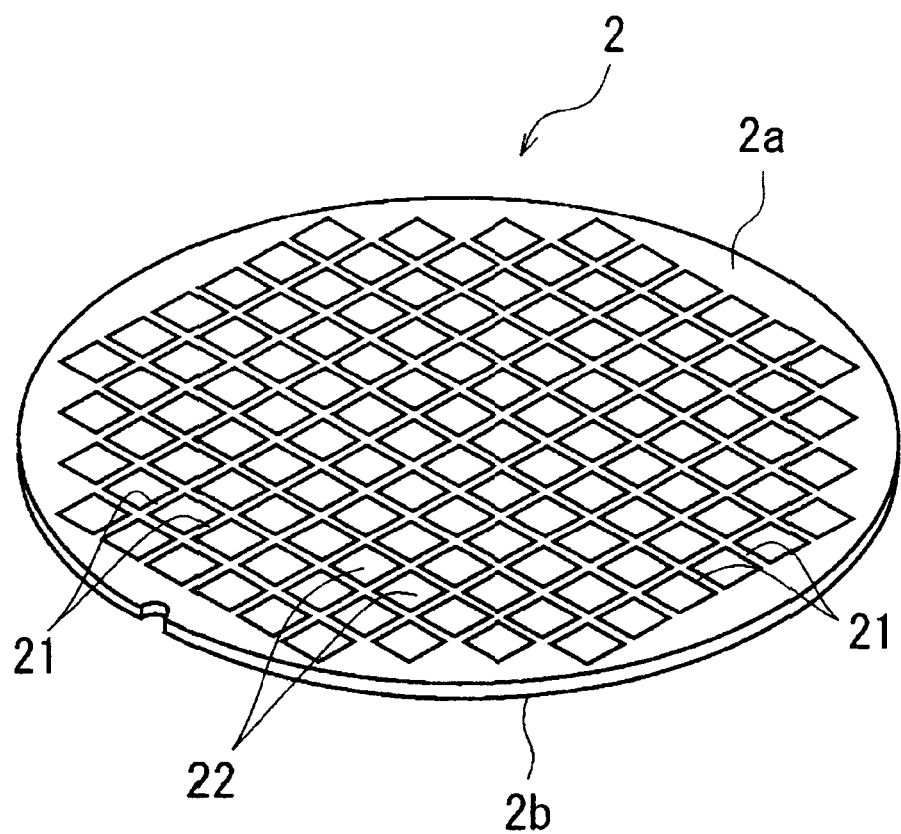
FIG. 1 is a perspective view of an optical device wafer which is to be divided by a dividing method for an optical device wafer according to the present invention.

In the following, preferred embodiments of a working method for an optical device wafer according to the present invention are described in detail with reference to the accompanying drawings. FIG. 1 shows an optical device wafer 2 which is to be divided by a working method for an optical device wafer according to the present invention. The optical device wafer 2 shown in FIG. 1 has a plurality of regions partitioned by streets 21 formed in a lattice on the surface 2a of a sapphire substrate which has, for example, a diameter of 50 mm and a thickness of 425 µm, and a plurality of optical devices 22 such as light emitting diodes altered in the partitioned regions.

Figure 2A:
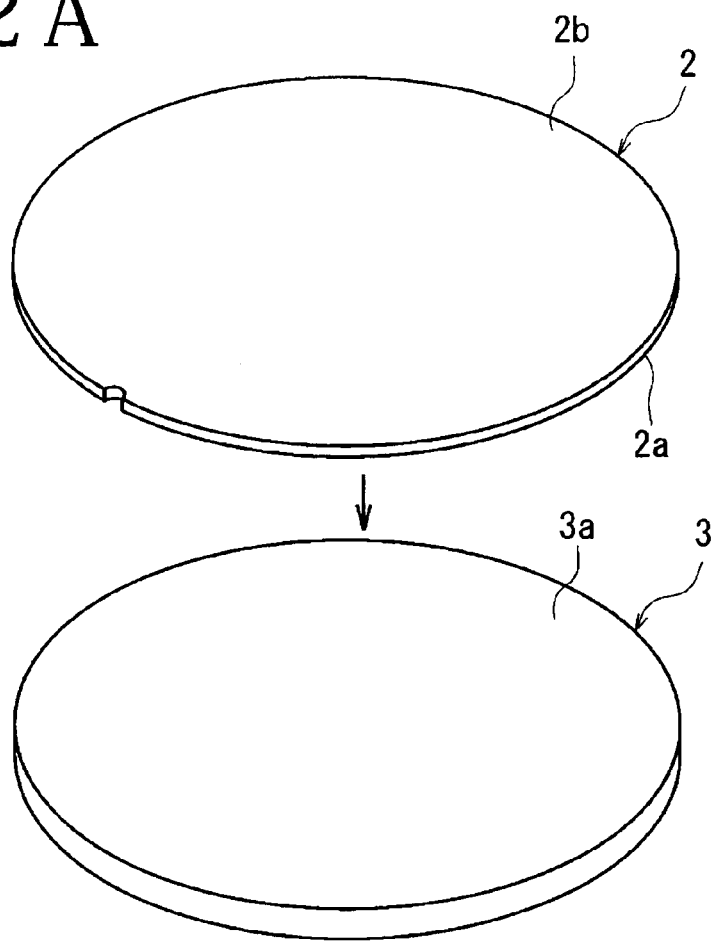
FIGS. 2A and 2B are explanatory views of a protective plate adhesion step in the dividing method for an optical device wafer according to the present invention.
Figure 2B:
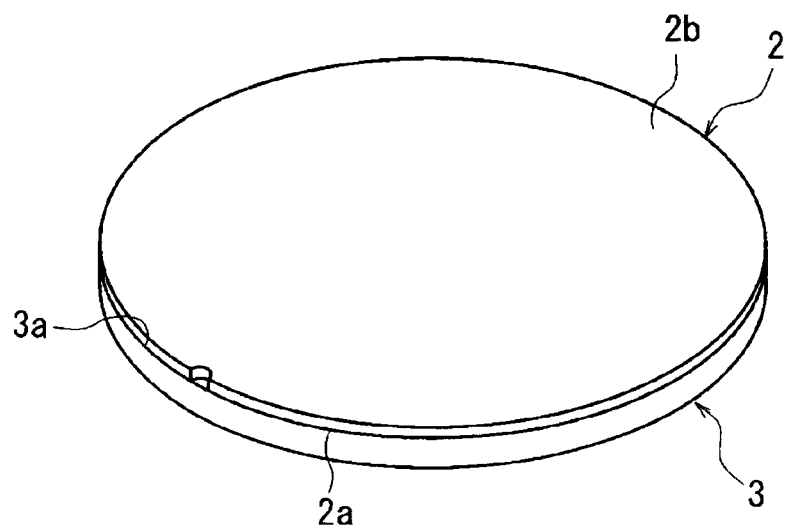

In order to divide the optical device wafer 2 described above into the individual optical devices 22 along the streets 21, a protective plate adhering step of adhering the surface 2a of the optical device wafer 2 to the surface 3a of a protective member 3 by a releasable bonding agent as seen in FIGS. 2A and 2B is carried out first. The protective member 3 is formed in a disk shape from a material having high rigidity such as a glass substrate, and the surface 3a and the reverse face 3b of the protective member 3 altered flat. The protective member 3 can be formed using a glass substrate or a silicon substrate and has, in the embodiment shown, a thickness set to 500 µm. Further, as the releasable bonding agent, for example, wax which melts at a temperature of 70° C. can be used.

After the protective plate adhering step described above is carried out, a reverse face grinding step of grinding the reverse face 2b of the optical device wafer 2 adhered to the protective member 3 so that the optical device wafer 2 is formed with a finish thickness of the devices. This reverse face grinding step is carried out, in the embodiment shown, by a rough grinding step and a finish grinding step. The rough grinding step is carried out using a grinding apparatus shown in FIG. 3. The grinding apparatus 4 shown in FIG. 3 includes a chuck table 41 for holding a work, and rough grinding means 42a for roughly grinding a working object face of the work held by the chuck table 41. The chuck table 41 sucks and holds the work on the upper face thereof and is rotated in the direction indicated by an arrow mark A in FIG. 3. The rough grinding means 42a includes a spindle housing 421a, a rotary spindle 422a supported for rotation on the spindle housing 421a and rotated by a rotational driving mechanism not shown, a mounter 423a mounted at a lower end of the rotary spindle 422a, and a rough grinding wheel 424a attached to a lower face of the mounter 423a. The rough grinding wheel 424a is formed from a disk-shaped base 425a, and a rough grinding grindstone 426a mounted annularly on a lower face of the base 425a and is attached at the base 425a thereof to the lower face of the mounter 423a by fastening bolts 427a. The rough grinding grindstone 426a is formed, in the embodiment shown, using a metal bond grindstone formed by sintering diamond abrasive grain of a particle size around φ60 µm with metal bond.

In order to carry out the rough grinding step using the grinding apparatus 4 described above, the optical device wafer 2 for which the protective plate adhering step described hereinabove has been carried out is placed at the protective member 3 side thereof on the upper face (holding face) of the chuck table 41, and the optical device wafer 2 is sucked to and held on the chuck table 41 through the protective member 3. Accordingly, the optical device wafer 2 sucked to and held on the chuck table 41 through the protective member 3 is directed such that the reverse face 2b thereof is positioned on the upper side. After the optical device wafer 2 is sucked to and held on the chuck table 41 in this manner, where the optical device wafer is formed from a sapphire substrate, the chuck table 41 is rotated, for example, at 300 rpm in the direction indicated by the arrow mark A while the rough grinding wheel 424a of the rough grinding means 42a is rotated, for example, at 1,000 rpm in the direction indicated by an arrow mark B and is contacted with the reverse face 2b of the optical device wafer 2. Then, the rough grinding wheel 424a is fed for grinding downwardly at a grinding feeding speed of, for example, 0.025 mm/minute to roughly grind the reverse face 2b of the optical device wafer 2. At this rough grinding step, grinding water is supplied to the grinding working location, and the supplying amount of the grinding water may be approximately 4 litters/minute. It is to be noted that the grinding amount at the rough grinding step is set, in the embodiment shown, to 345 μm. Accordingly, the thickness of the optical device wafer 2 for which the rough grinding step is carried out is, in the embodiment shown, 80 μm.

Figure 3:
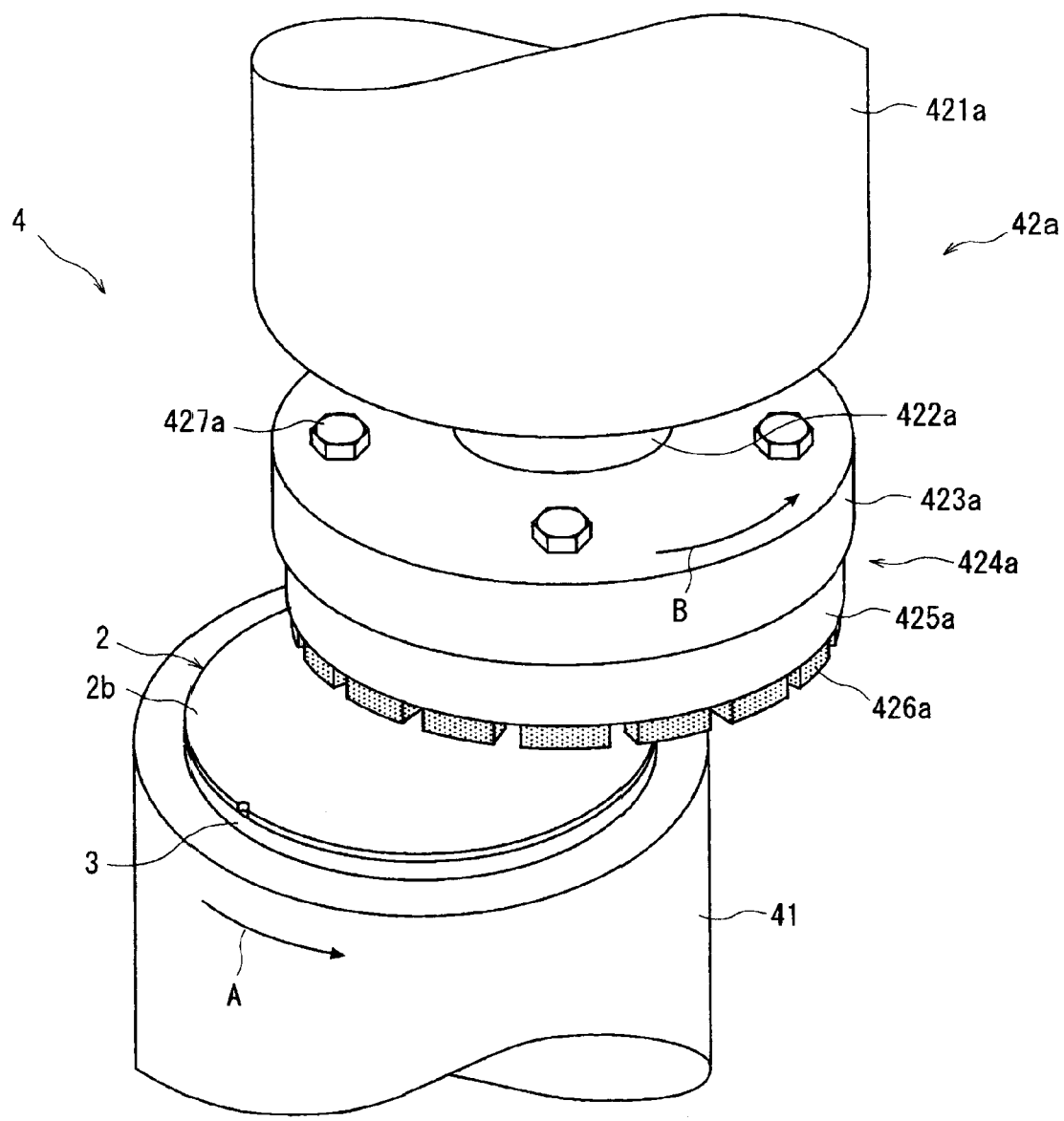
FIG. 3 is an explanatory view illustrating a rough grinding step of a reverse face grinding step in the dividing method for an optical device wafer according to the present invention.
Figure 4:
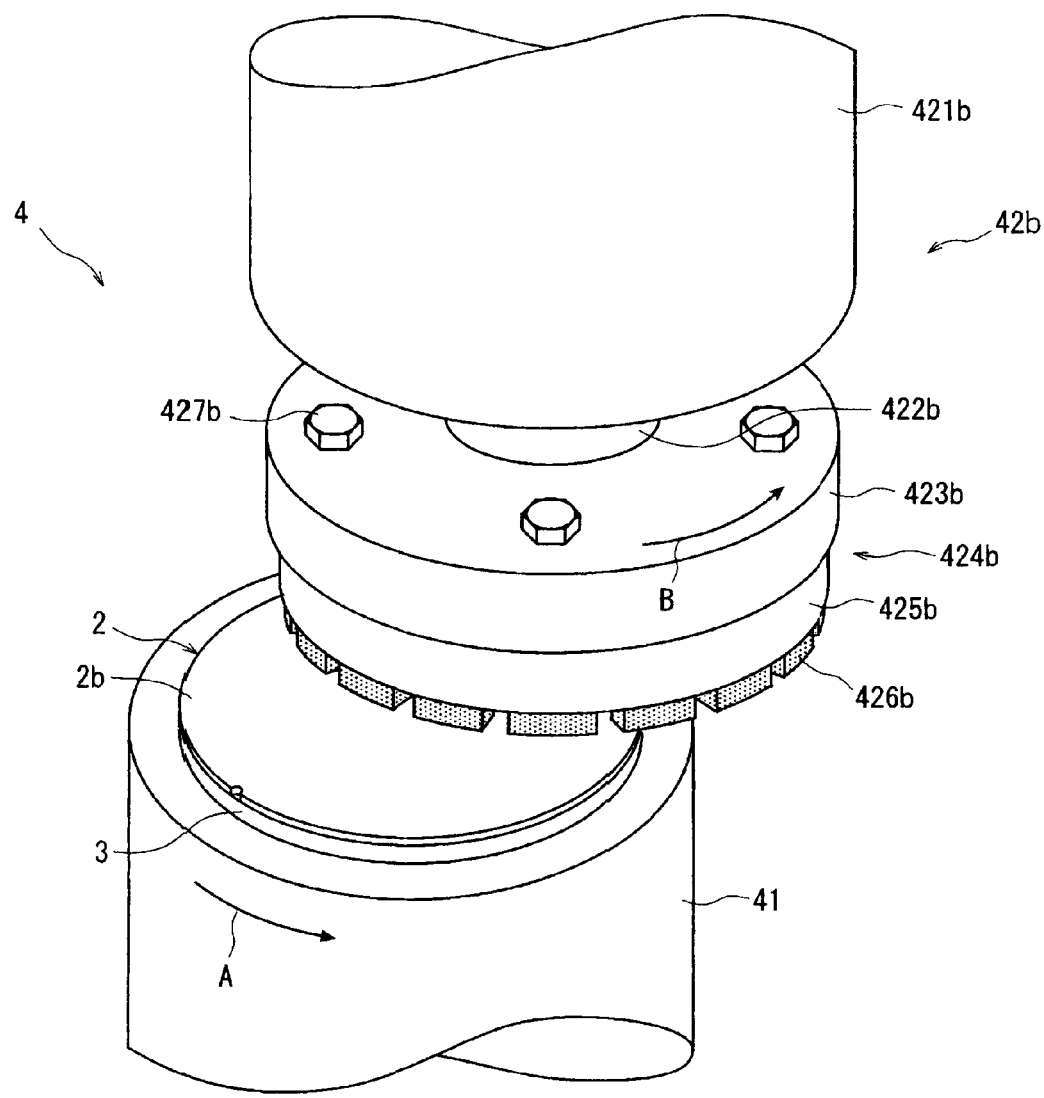
FIG. 4 is an explanatory view illustrating a finish grinding step of the reverse face grinding step in the dividing method for an optical device wafer according to the present invention.

After the rough grinding step described above is carried out, a finish grinding step is carried out. This finish grinding step is carried out using a grinding apparatus 4, which is substantially similar to the grinding apparatus 4 described hereinabove with reference to FIG. 3, as shown in FIG. 4. In particular, the grinding apparatus 4 shown in FIG. 4 includes a chuck table 41, and finish grinding means 42b for finish grinding a working object face of the wafer held on the chuck table 41. The finish grinding means 42b includes a spindle housing 421b, a rotary spindle 422b supported for rotation on the spindle housing 421b and rotated by a rotational driving mechanism not shown, a mounter 423b mounted at a lower end of the rotary spindle 422b, and a finish grinding wheel 424b attached to a lower face of the mounter 423b. This finish grinding wheel 424b is formed from a disk-shaped base 425b and a finish grinding grindstone 426b mounted annularly on a lower face of the base 425b and is attached at the base 425b thereof to the lower face of the mounter 423b by fastening bolts 427b. The finish grinding grindstone 426b is formed, in the embodiment shown, using a resin bond grindstone formed by sintering diamond abrasive grain of a particle size of φ10 μm with resin bond. The finish grinding means 42b configured in this manner is generally disposed on the same grinding apparatus as that of the rough grinding means 42a and is configured such that the chuck table 41 which holds the work roughly ground by the rough grinding means 42a is moved into a working region of the finish grinding means 42b.

Now, the finish grinding step carried out using the finish grinding means 42b described above is described with reference to FIG. 4. The chuck table 41 which holds the optical device wafer 2 for which the rough grinding step has been carried out by the rough grinding means 42a is moved into the working region of the finish grinding means 42b shown in FIG. 4. After the chuck table 41 is moved into the working region shown in FIG. 4, where the optical device wafer is formed from a sapphire substrate, the chuck table 41 is rotated, for example, at 300 rpm in the direction indicated by an arrow mark A while the finish grinding wheel 424b of the finish grinding means 42b is rotated, for example, at 1,500 rpm in the direction indicated by an arrow mark B and is contacted with the reverse face 2b of the optical device wafer 2. Then, the finish grinding wheel 424b is fed for grinding downwardly at a grinding feeding speed of, for example, 0.009 mm/minute to finish grind the reverse face 2b of the optical device wafer 2. At this finish grinding step, grinding water is supplied to the grinding working location, and the supplying amount of the grinding water may be approximately 4 litters/minute. It is to be noted that the grinding amount at the finish grinding step is set, in the embodiment shown, to 55 μm. Accordingly, the thickness of the optical device wafer 2 for which the finish grinding step is carried out is, in the embodiment shown, 25 μm.

Although the optical device wafer 2 for which the reverse face grinding step including the rough grinding step and the finish grinding step has been carried out in such a manner as described above is formed with a very small thickness of 25 μm, since it is adhered to the protective member 3 having high rigidity, it does not break at all.

Figure 5A:
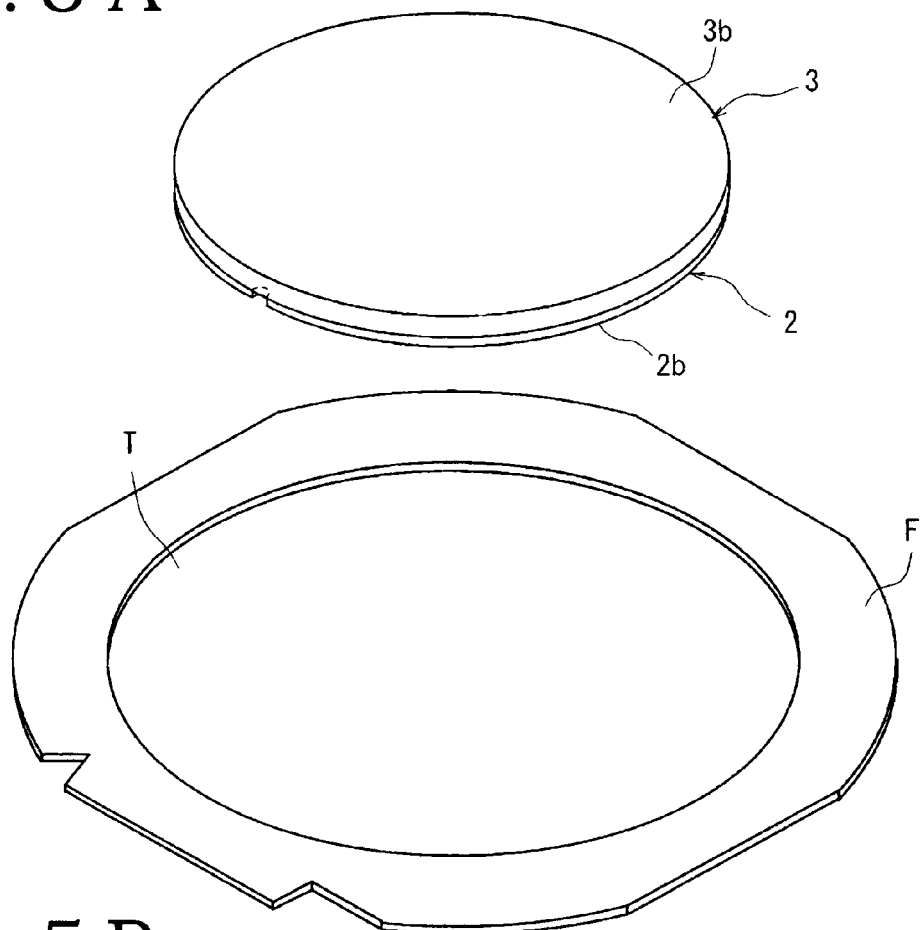
FIGS. 5A and 5B are explanatory views of a dicing tape sticking step in the dividing method for an optical device wafer according to the present invention.
Figure 5B:
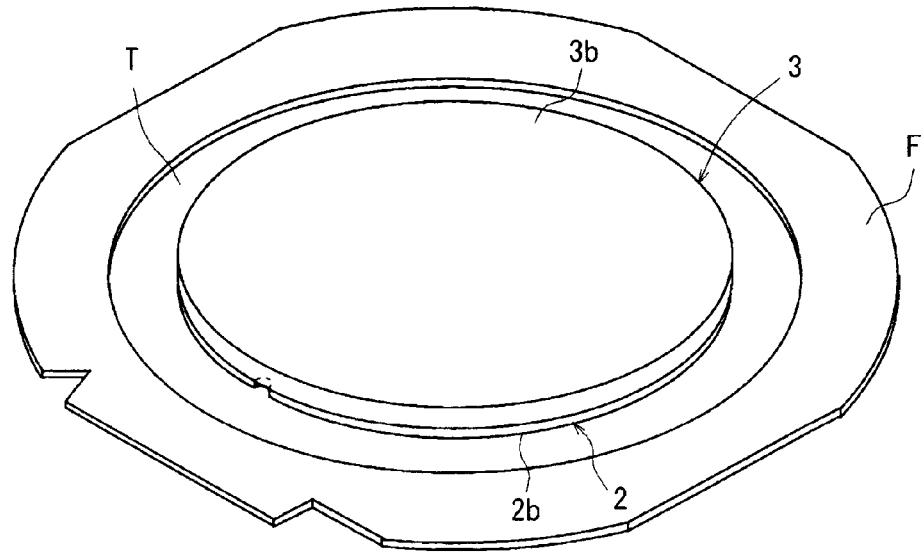

After the reverse face grinding step described above is carried out, a dicing tape sticking step of sticking the reverse face of the optical device wafer 2 to the surface of a dicing tape is carried out. In particular, the reverse face 2b of the optical device wafer 2 for which the reverse face grinding step has been carried out is stuck on the surface of a dicing tape T mounted on an annular frame F as shown in FIGS. 5A and 5B. Accordingly, the reverse face 3b of the protective member 3 adhered to the surface 2a of the optical device wafer 2 is positioned on the upper side.

Thereafter, a protective plate grinding step of grinding the protective member 3 adhered to the optical device wafer 2 stuck on the dicing tape T so as to have a predetermined thickness. This protective plate grinding step includes, in the embodiment shown, a rough grinding step carried out using the grinding apparatus 4 described hereinabove with reference to FIG. 3 and a finish grinding step carried out using the grinding apparatus 4 described hereinabove with reference to FIG. 4.

Figure 6:
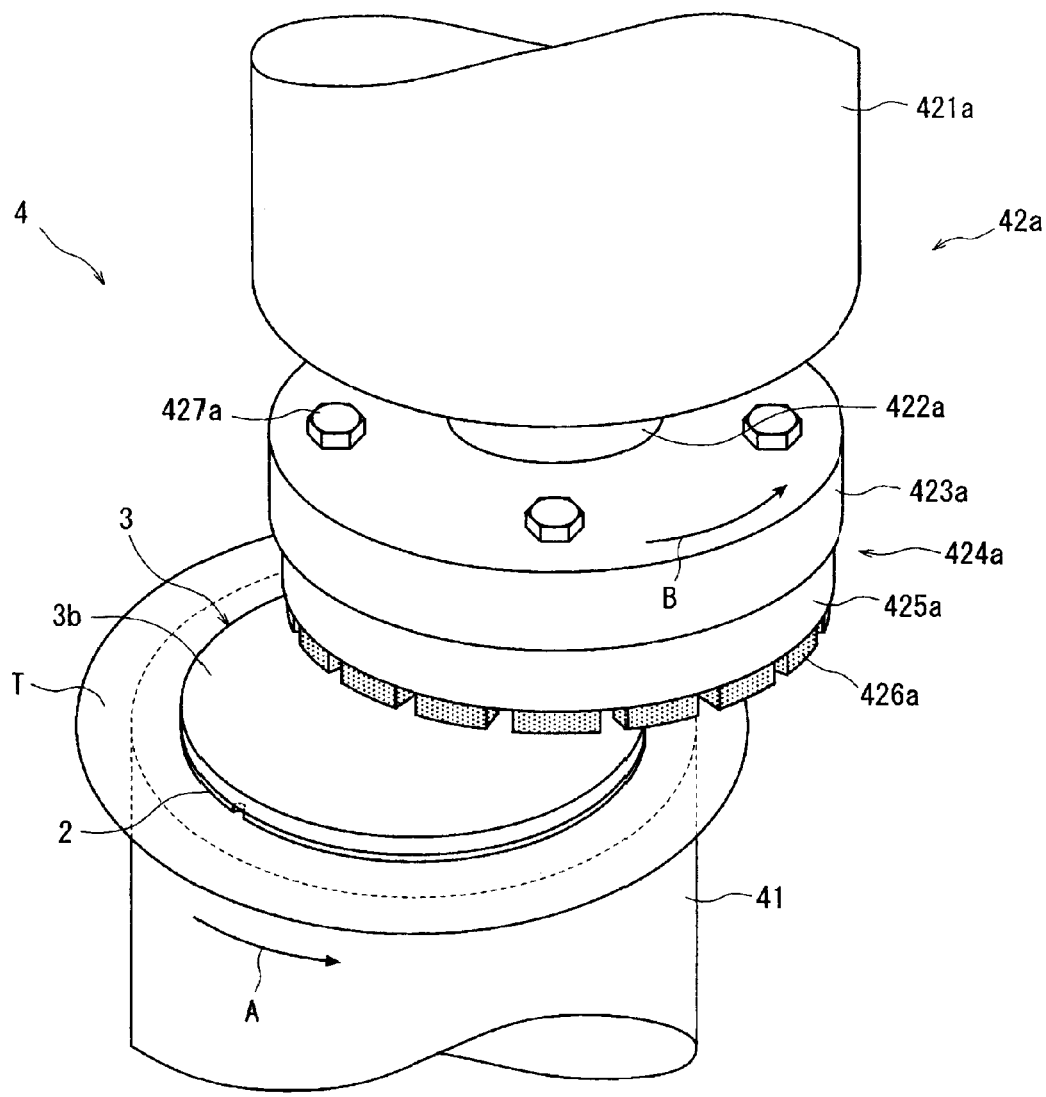
FIG. 6 is an explanatory view illustrating a rough grinding step of a protective plate grinding step in the dividing method for an optical device wafer according to the present invention.

In order to carry out the rough grinding step using the grinding apparatus 4 described hereinabove with reference to FIG. 3, the dicing tape T side to which the optical device wafer 2 for which the dicing tape sticking step described above has been carried out and to which the protective member 3 is adhered is placed on the upper face (holding face) of the chuck table 41 as shown in FIG. 6, and the optical device wafer 2 to which the protective member 3 is adhered is sucked to and held on the chuck table 41 through the dicing tape T. It is to be noted that, while, in FIG. 6, the annular frame F on which the dicing tape T is mounted is not shown, the frame F is held by suitable frame holding means disposed on the chuck table 41. Accordingly, the protective member 3 adhered to the optical device wafer 2 sucked to and held on the chuck table 41 through the dicing tape T is directed such that the reverse face 3b thereof is positioned on the upper side. Thereafter, the chuck table 41 is rotated, for example, at 300 rpm in the direction indicated by an arrow mark A while the rough grinding wheel 424a of the rough grinding means 42a is rotated, for example, at 6,000 rpm in the direction indicated by an arrow mark B and is contacted with the reverse face 3b of the protective member 3 adhered to the optical device wafer 2. Then, the rough grinding wheel 424a is fed for grinding downwardly at a grinding feeding speed of, for example, 0.02 mm/min to roughly grind the reverse face 3b of the protective member 3. At this rough grinding step, grinding water is supplied to the grinding working location, and the supplying amount of the grinding water may be approximately 4 litters/minute. It is to be noted that the grinding amount at the rough grinding step is set, in the embodiment shown, to 400 μm. Accordingly, the thickness of the protective member 3 for which the rough grinding step has been carried out is, in the embodiment shown, 100 μm.

Figure 7:
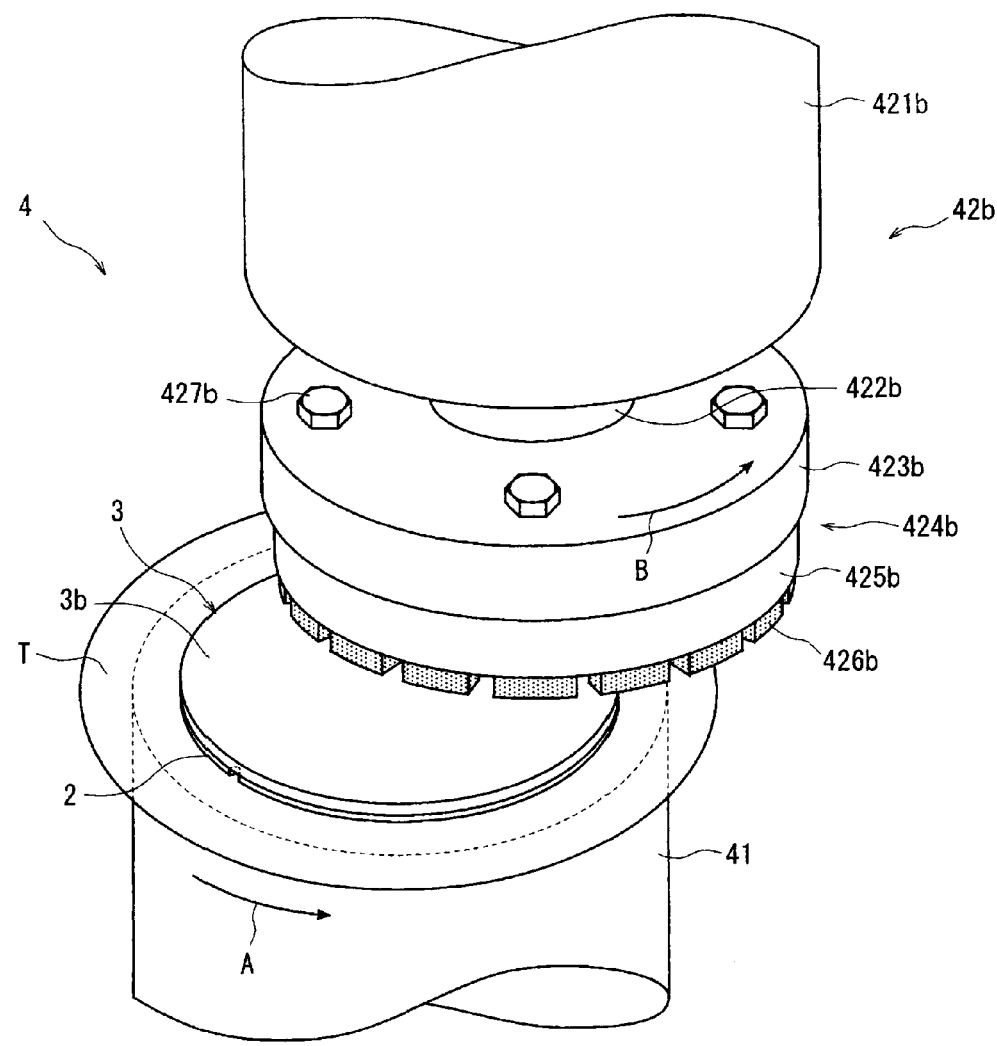
FIG. 7 is an explanatory view illustrating a finish grinding step of the protective plate grinding step in the dividing method for an optical device wafer according to the present invention.

The finish grinding step carried out using the finish grinding means 42b described hereinabove with reference to FIG. 4 after the rough grinding step described above is carried out is described with reference to FIG. 7. The chuck table 41 which holds the optical device wafer 2, to which the protective plate 3 for which the rough grinding step has been carried out by the rough grinding means 42a described hereinabove, through the dicing tape T is moved into the working region of the finish grinding means 42b shown in FIG. 7. After the chuck table 41 is moved into the working region of shown in FIG. 7, the chuck table 41 is rotated, for example, at 300 rpm in the direction indicated by an arrow mark A while the finish grinding wheel 424b of the finish grinding means 42b is rotated, for example, at 6,000 rpm in the direction indicated by an arrow mark B and is contacted with the reverse face 3b of the protective member 3. Then, the finish grinding wheel 424b is fed for grinding downwardly at a grinding feeding speed of, for example, 0.03 mm/minute to finish grind the reverse face 3b of the protective member 3. At this finish grinding step, grinding water is supplied to the grinding working location, and the supplying amount of the grinding water may be approximately 4 litters/minute. It is to be noted that the grinding amount at the finish grinding step is set, in the embodiment described, to 70 µm. Accordingly, the thickness of the protective member 3 for which the finish grinding step has been carried out is, in the embodiment shown, 30 µm.

After the protective plate grinding step is carried in such a manner as described above, a laser working step of irradiating a laser beam along a street 21 formed on the optical device wafer 2 upon the protective member 3 to carry out laser working which forms a break starting point along the street 21 for the protective member 3. This laser working step is carried out using a laser working apparatus shown in FIG. 8. The laser working apparatus 5 shown in FIG. 8 includes a chuck table 51 for holding a work, laser beam irradiation means 52 for irradiating a laser beam upon the work held on the chuck table 51, and image pickup means 53 for picking up an image of the work held on the chuck table 51. The chuck table 51 is configured so as to suck and hold the work, and is moved in a working feeding direction indicated by an arrow mark X in FIG. 8 by working feeding means not shown and is moved in an indexing feeding direction indicated by an arrow mark Y in FIG. 8 by indexing feeding means not shown.

The laser beam irradiation means 52 includes a casing 521 of a cylindrical shape disposed substantially horizontally. In the casing 521, pulsed laser beam oscillation means including a pulsed laser beam oscillator and cycle frequency setting means not shown is disposed. At an end portion of the casing 521, a condenser 522 for condensing the pulsed laser beam oscillated from the pulsed laser beam oscillation means is mounted.

The image pickup means 53 mounted at an end portion of the casing 521 which forms the laser beam irradiation means 52 includes, in the embodiment shown, in addition to an ordinary image pickup element (CCD) for picking up an image from a visible beam, infrared ray illumination means for irradiating an infrared ray upon a work, an optical system for catching the infrared ray irradiated by the infrared ray illumination means, an image pickup element (infrared CDD) for outputting an electric signal corresponding to the infrared ray caught by the optical system, and so forth, and sends the picked up image signal to control means not shown.

Figure 8:
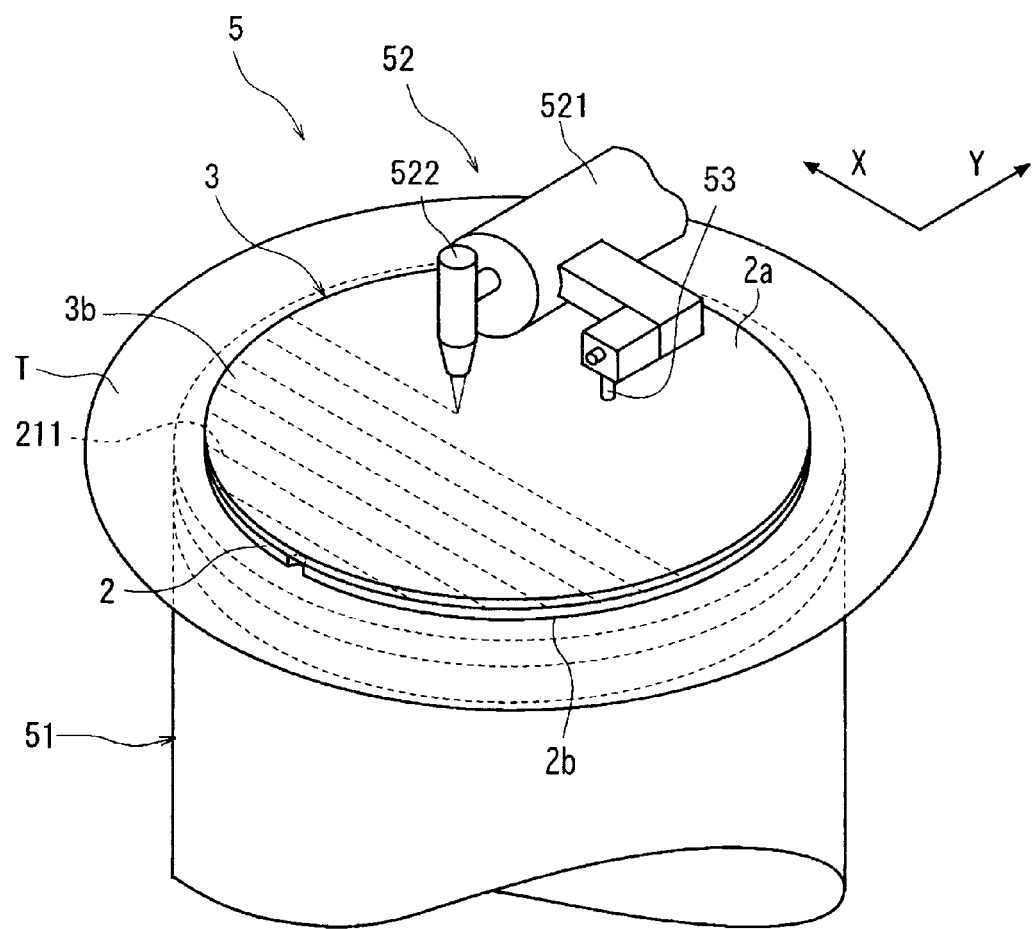
FIG. 8 is a perspective view showing essential part of a laser working apparatus for carrying out a laser working step in the dividing method for an optical device wafer according to the present invention.

In the following, the laser working step of carrying out laser working which forms a break starting point along a street 21 for the protective member 3 using the laser working apparatus 5 described hereinabove is described. A first embodiment of this laser working step carries out a altered layer forming step of forming a altered layer along a street 21 formed on the optical device wafer 2 in the inside of the protective member 3. In order to carry out the altered layer forming step, the dicing tape T side of the optical device wafer 2 to which the protective member 3 is adhered is placed on the chuck table 51 of the laser working apparatus 5 as shown in FIG. 8. Then, the optical device wafer 2 is sucked to and held on the chuck table 51 by suction means not shown (wafer holding step). Accordingly, the reverse face 3b of the protective member 3 adhered to the optical device wafer 2 sucked to and held on the chuck table 51 is directed such that the reverse face 3b thereof is positioned on the upper side. It is to be noted that, while, in FIG. 8, the annular frame F on which the dicing tape T is mounted is not shown, the annular frame F is held by suitable frame holding means disposed on the chuck table 51.

After the wafer holding step is carried out in such a manner as described above, a altered layer forming step of irradiating a pulsed laser beam of a wavelength having permeability with respect to the protective member 3 along a street 21 formed on the optical device wafer 2 from the reverse face 3b side of the protective member 3 to form a altered layer along the street 21 in the inside of the protective member 3 is carried out. In order to carry out the altered layer forming step, the chuck table 51 to and on which the protective member 3 adhered to the optical device wafer 2 is sucked and held is first positioned just below the image pickup means 53 by a moving mechanism not shown. Then, an alignment operation of detecting a working region of the reverse face 3b to be subjected to laser working is executed by the image pickup means 53 and the control means not shown. In particular, the image pickup means 53 and the control means not shown execute an image process such as pattern matching for carrying out positioning of a street 21 formed in a predetermined direction of the optical device wafer 2 and the condenser 522 of the laser beam irradiation means 52 for irradiating a laser beam along the street 21 to carry out alignment of the laser beam irradiation position. Also for a street 21 extending perpendicularly to the predetermined direction and formed on the optical device wafer 2, alignment of the laser beam irradiation position is carried out similarly (alignment step). At this time, although the surface 2a of the optical device wafer 2 on which the streets 21 altered is positioned on the lower side of the protective member 3, since the image pickup means 53 includes the infrared ray illumination means and the image pickup means formed from the optical system for catching an infrared ray, the image pickup element (infrared CCD) for outputting an electric signal corresponding to the infrared ray as described above, the image pickup means 53 can pick up an image of the street 21 through the protective member 3.

Figure 9A:
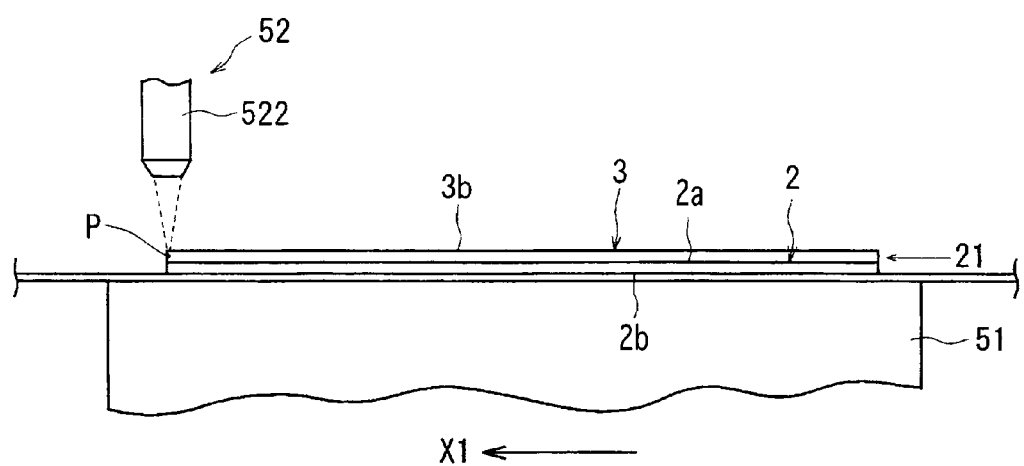
FIGS. 9A and 9B are explanatory views illustrating a altered layer forming step of the laser working step in the dividing method for an optical device wafer according to the present invention.
Figure 9B:
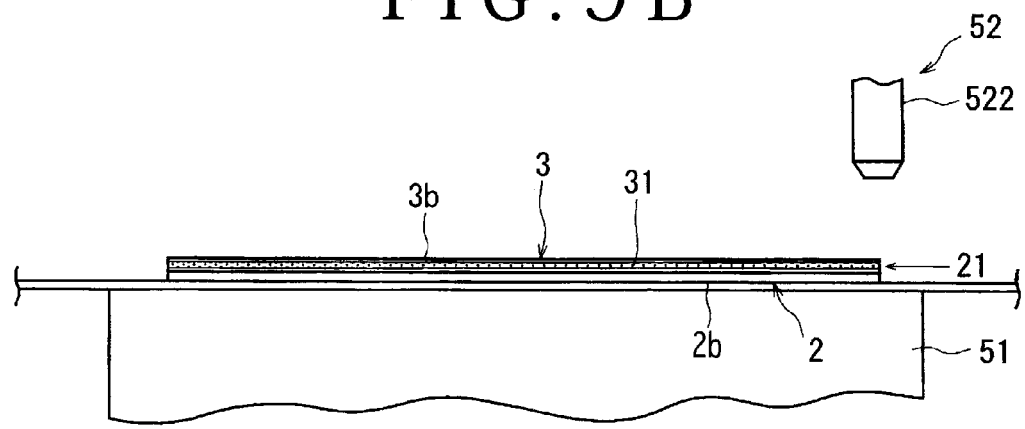

After the alignment step is carried out in such a manner as described above, the chuck table 51 is moved into the laser beam irradiation region in which the condenser 522 of the laser beam irradiation means 52 for irradiating a laser beam is positioned as seen in FIG. 9A and one end (left end in FIG. 9A) of a predetermined street 21 is positioned just below the condenser 522 of the laser beam irradiation means 52. Then, a pulsed laser beam of a wavelength having permeability with respect to the protective member 3 is irradiated from the condenser 522 while the chuck table 51 is moved at a predetermined feeding speed in the direction indicated by an arrow mark X1 in FIG. 9A. Then, when the irradiation position of the condenser 522 reaches the position of the other end of the street 21 as seen in FIG. 9B, the irradiation of the pulsed laser beam is stopped and the movement of the chuck table 51 is stopped. At this altered layer forming step, the condensing point P of the pulsed laser beam is positioned at an intermediate portion (inside) of the protective member 3 in the thicknesswise direction. As a result, a altered layer 31 is formed along the street 21 in the inside of the protective member 3.

The working conditions at the altered layer forming step are set, for example, in the following manner:

Light source: Er pulsed laser
Wavelength: 1,560 nm
Cycle frequency: 90 to 200 kHz
Average output power: 0.8 to 1.2 W
Working feeding speed: 100 to 300 mm/second After the altered layer forming step is executed along all of the streets 21 extending in the predetermined direction of the optical device wafer 2 in such a manner as described above, the chuck table 51 is rotated by 90 degrees and the altered layer forming step described above is carried out for the streets 21 extending perpendicularly to the predetermined direction.

Now, a second embodiment of the laser working step for carrying out laser working which forms a break starting point along the street 21 for the protective member 3 is described. The second embodiment of the laser working step carries out a laser worked groove forming step of forming a laser worked groove along a street 21 formed on the optical device wafer 2 on the reverse face 3b of the protective member 3. It is to be noted that the laser worked groove forming step is carried out using a laser working apparatus similar to the laser working apparatus 5 described hereinabove with reference to FIG. 8. In order to carry out the laser worked groove forming step, a wafer holding step and an alignment step similar to those of the altered layer forming step are carried out first.

Figure 10A:
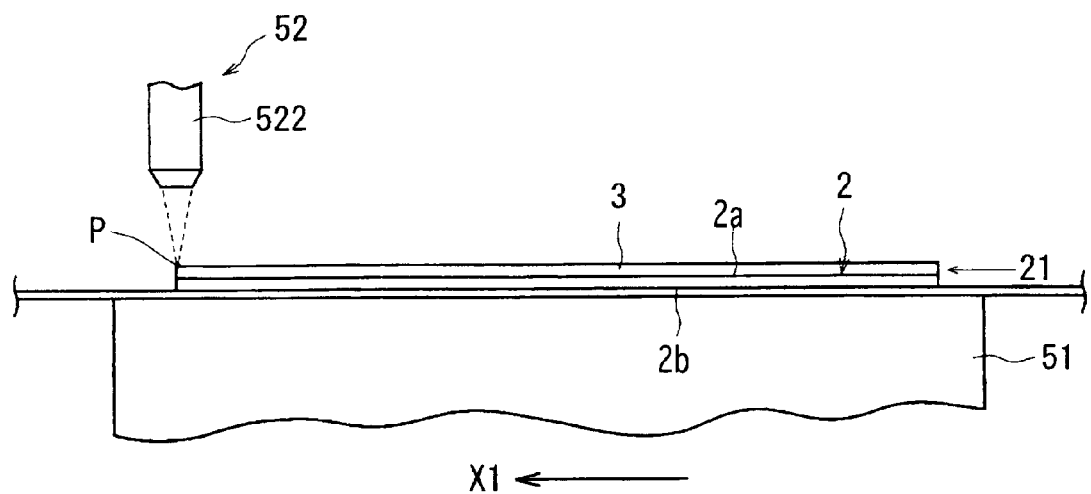
FIGS. 10A and 10B are explanatory views illustrating a laser worked groove forming step of the laser working step in the dividing method for an optical device wafer according to the present invention.
Figure 10B:
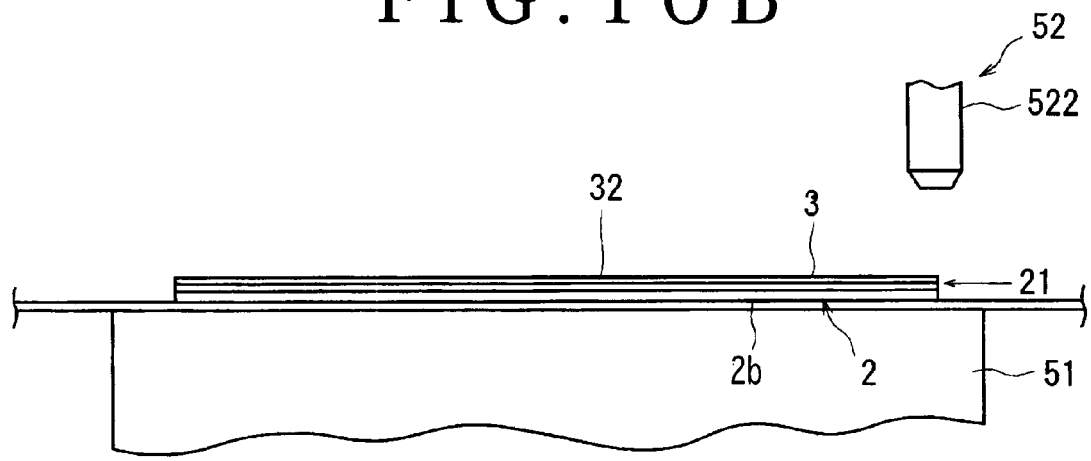

After the alignment step is carried out, the chuck table 51 is moved into the laser beam irradiation region in which the condenser 522 of the laser beam irradiation means 52 for irradiating a laser beam is positioned as shown in FIG. 10A, and one end (left end in FIG. 10A) of a predetermined street 21 is positioned just below the condenser 522 of the laser beam irradiation means 52. Then, a pulsed laser beam of a wavelength having absorbency with respect to the protective member 3 is irradiated from the condenser 522 while the chuck table 51 is moved at a predetermined feeding speed in the direction indicated by an arrow mark X1 in FIG. 10A. Then, when the irradiation position of the condenser 522 reaches the position of the other end of the street 21 as seen in FIG. 10B, the irradiation of the pulsed laser beam is stopped and the movement of the chuck table 51 is stopped. At this laser worked groove forming step, the condensing point P of the pulsed laser beam is positioned in the proximity of the reverse face 3b (upper face) of the protective member 3. As a result, a laser worked groove 32 is formed along the street 21 on the reverse face 3b of the protective member 3.

The working conditions at the laser worked groove forming step are set, for example, in the following manner:

Light source: YAG pulsed laser
Wavelength: 355 nm
Cycle frequency: 90 to 200 kHz
Average output power: 0.8 to 1.2 W
Working feeding speed: 100 to 300 mm/second After the laser worked groove forming step is executed along all of the streets 21 extending in the predetermined direction of the optical device wafer 2 in such a manner as described above, the chuck table 51 is rotated by 90 degrees and the laser worked groove forming step described above is executed along the streets 21 extending perpendicularly to the predetermined direction.

Thereafter, a wafer dividing step of applying external force to the protective member 3 for which the laser working step described above has been carried out to break the protective member 3 along the break starting points (altered layers 31 or laser worked grooves 32) to break the optical device wafer 2 along the streets 21 to divide the optical device wafer 2 into individual optical devices. At this wafer dividing step, the reverse face 3b of the protective member 3 for which the laser working step described above has been carried out is placed on a flexible rubber sheet 6, for example, as seen in FIG. 11A. Accordingly, the optical device wafer 2 on which the surface 3a of the protective member 3 is stuck comes to the upper side, and the dicing tape T on which the optical device wafer 2 is stuck is positioned at the top. Then, a pressure roller 60 is pressed against and rolled along the upper face of the frame F, whereupon the protective member 3 is broken along the streets 21 while the altered layers 31 or the laser worked grooves 32 serve as break starting points as seen in FIGS. 11B and 11C.

Since the optical device wafer 2 on which the protective member 3 is stuck is formed with such a very small thickness as 25 μm as described hereinabove, the optical device wafer 2 is broken along the streets 21 and divided into the individual optical devices 22 by the break of the protective member 3 along the street 21. Since a formed portion by the laser working does not exist on the side faces (break faces) of the optical devices 22 divided in this manner, the luminance of the optical devices 22 does not drop at all and the bending resisting strength does not drop at all either. Since the optical devices 22 divided individually have the dicing tape T adhered to the reverse face thereof, they are not separated from each other but keep the form of the optical device wafer 2.

Figure 12:
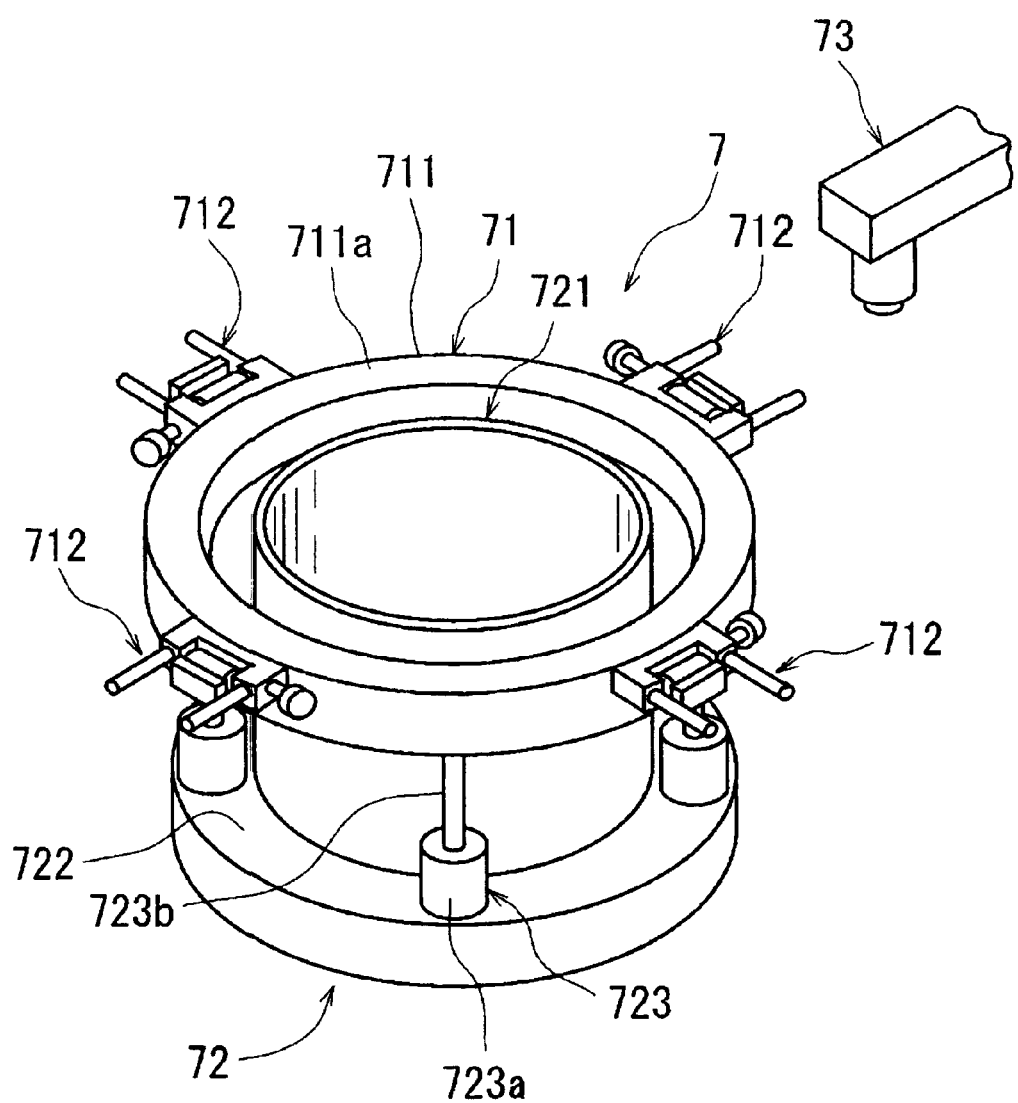
FIG. 12 is a perspective view of a pickup apparatus for carrying out a pickup step in the dividing method for an optical device wafer according to the present invention.

Thereafter, a pickup step of removing the optical devices 22 divided by the carrying out of the wafer dividing step from the dicing tape T and picking up the optical devices 22 is carried out. This pickup step is carried out using a pickup apparatus 7 shown in FIG. 12. The pickup apparatus 7 shown in FIG. 12 includes frame holding means 71 for holding the annular frame F described hereinabove, tape extension means 72 for extending the dicing tape T mounted on the annular frame F held by the frame holding means 71, and a pickup collet 73. The frame holding means 71 is formed from an annular frame holding member 711, and a plurality of clamps 712 as fixing means disposed on an outer periphery of the frame holding member 711. An upper face of the frame holding member 711 forms a receiving face 711a for receiving the annular frame F, and the annular frame F is placed on the receiving face 711a. Then, the annular frame F placed on the receiving face 711a is fixed to the frame holding member 711 by the clamps 712. The frame holding means 71 configured in this manner is supported for movement in the upward and downward directions by the tape extension means 72.

Figure 13A:
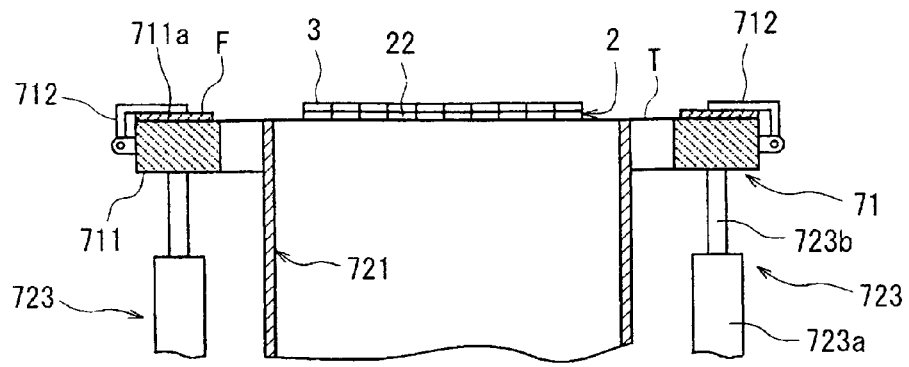
FIGS. 13A to 13C are explanatory views of the pickup step in the dividing method for an optical device wafer according to the present invention.
Figure 13B:
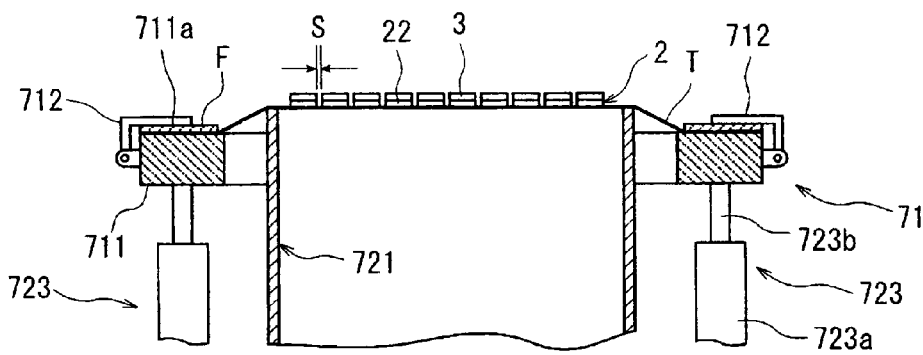

The tape extension means 72 includes an extension drum 721 disposed on the inner side of the annular frame holding member 711 described above. The extension drum 721 has an inner diameter and an outer diameter which are smaller than the inner diameter of the annular frame F but greater than the outer diameter of the optical device wafer 2 stuck on the dicing tape T mounted on the annular frame F. Further, the extension drum 721 has a support flange 722 provided at a lower end thereof. The tape extension means 72 in the embodiment shown includes support means 723 which can move the annular frame holding member 711 in the upward and downward directions. This support means 723 is formed from a plurality of air cylinders 723a disposed on the support flange 722, and piston rods 723b of the air cylinders 723a are connected to a lower face of the annular frame holding member 711. The support means 723 formed from the plural air cylinders 723a in this manner moves the annular frame holding member 711 in the upward and downward directions between a reference position at which the receiving face 711a is positioned at a substantially same height as that of the upper end of the extension drum 721 as seen in FIG. 13A and an extension position lower by a predetermined amount from the upper end of the extension drum 721 as seen in FIG. 13B.

The pickup step carried out using the pickup apparatus 7 configured in such a manner as described above is described with reference to FIGS. 13A to 13C. In particular, the annular frame F on which the dicing tape T on which the optical device wafer 2 (divided in the individual optical devices 22 along the streets 21) is stuck is mounted is placed on the receiving face 711a of the frame holding member 711 which forms the frame holding means 71 as seen in FIG. 13A and is fixed to the frame holding member 711 by the clamps 712. At this time, the frame holding member 711 is positioned at the reference position illustrated in FIG. 13A. Then, the plural air cylinders 723a as the support means 723 which forms the tape extension means 72 are rendered operative to move the annular frame holding member 711 downwardly to the extending position shown in FIG. 13B. Accordingly, since also the annular frame F fixed to the receiving face 711a of the frame holding member 711 moves down, the dicing tape T mounted on the annular frame F is contacted with and extended by the upper end edge of the extension drum 721 as seen in FIG. 13B. As a result, the distance between the optical devices 22 stuck on the dicing tape T is expanded to enlarge the gap S.

Figure 13C:
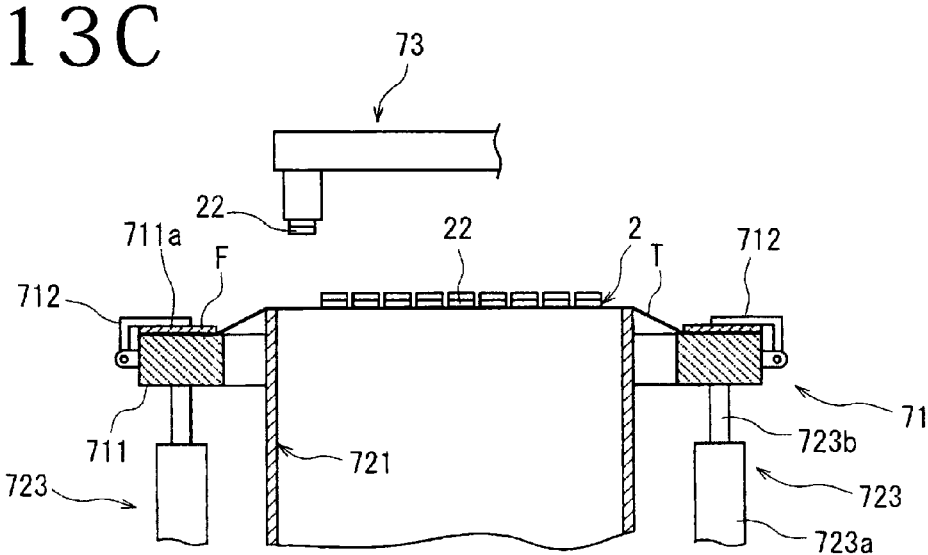

Thereafter, the pickup collet 73 is rendered operative to suck the protective member 3 stuck on the optical devices 22 to remove the protective member 3 from the dicing tape T and pick up the protective member 3 as seen in FIG. 13C and transport the protective member 3 to a tray not shown. Since, at the pickup step described above, the gap S between the optical devices 22 is extended as described above, each optical device 22 can be picked up readily without contacting with an adjacent optical device 22.

The protective member 3 adhered to the optical devices 22 picked up in such a manner as described above is removed from the optical devices 22 before a die bonding step which is a next step is carried out (protective plate removing step). At this time, the protective member 3 is heated to approximately 70° C. so that the wax by which the optical device wafer 2 and the protective member 3 are adhered to each other is melted. Consequently, the protective member 3 can be removed readily from the optical device wafer 2. It is to be noted that the protective plate removing step of removing the protective member 3 from the optical device wafer 2 may be carried out before the pickup step is carried out.

It is to be noted that, in order to facilitate break of the optical device wafer 2 along the street 21 at the wafer dividing step, a altered layer may be formed along the streets 21 in the inside of the optical device wafer 2 before the altered layer forming step is carried out for the protective member 3 at the laser working step. In this instance, a laser beam of a wavelength having permeability with respect to the optical device wafer 2 is irradiated with the focus point thereof adjusted to the inside of the optical device wafer 2 through the protective member 3 to form altered layers which serve as break starting points along the streets 21 in the inside of the optical device wafer 2.

The present invention is not limited to the details of the above described preferred embodiments. The scope of the invention is defined by the appended claims and all changes and modification as fall within the equivalence of the scope of the claims are therefore to be embraced by the invention.

What is claimed is:

1. A working method for an optical device wafer for dividing an optical device wafer having optical devices formed in a plurality of regions of a surface thereof partitioned by a plurality of streets formed in a lattice into the individual optical devices along the plural streets, comprising:
   a protective plate adhering step of adhering the surface of the optical device wafer to a surface of a protective plate, which has high rigidity, by a releasable bonding agent;
   a reverse face grinding step of grinding a reverse face of the optical device wafer adhered to the protective plate so that the optical device wafer has a finish thickness of the devices;
   a dicing tape sticking step of sticking the reverse face of the optical device wafer, for which the reverse face grinding step has been carried out, on a surface of a dicing tape;
   a protective plate grinding step of grinding the reverse face of the protective plate adhered to the optical device wafer stuck on the dicing tape so as to have a predetermined thickness;
   a laser working step of irradiating a laser beam upon the protective plate, for which the protective plate grinding step has been carried out, along the streets formed on the optical device wafer to carry out laser working, which forms break starting points along the streets, for the protective plate;
   a wafer dividing step of applying external force to the protective plate, for which the laser working step has been carried out, to break the protective plate along the break starting points to break the optical device wafer along the streets thereby to divide the optical device wafer into the individual optical devices; and
   a pickup step of picking up the individually divided devices stuck on the dicing tape for which the wafer dividing step has been carried out.

2. The working method for the optical device wafer according to claim 1, wherein, at the laser working step, a laser beam of a wavelength having permeability with respect to the protective plate is irradiated with a focus point thereof adjusted to the inside of the protective plate to form altered layers, which serve as the break starting points, along the streets in the inside of the protective plate.

3. The working method for the optical device wafer according to claim 1, wherein, at the laser working step, a laser beam of a wavelength having absorbency with respect to the protective plate is irradiated to form laser worked grooves, which serve as the break starting points, along the streets on the reverse face of the protective plate.

4. The working method for the optical device wafer according to claim 1, further comprising a protective plate removing step of removing the protective plate stuck on the divided optical devices before or after the pickup step is carried out after the wafer dividing step.

* * * * *